United States Patent [19]
Chiou

[11] Patent Number: 5,903,434
[45] Date of Patent: May 11, 1999

[54] CPU HEAT SINK CLAMPING DEVICE

[76] Inventor: Ming Chin Chiou, No. 2, Alley 1, Lane 160, Kai De St., Chien Chen Chu, Kau Hsiung City, Taiwan

[21] Appl. No.: 08/872,069

[22] Filed: Jun. 10, 1997

[51] Int. Cl.[6] ............................................ H05K 7/20

[52] U.S. Cl. .................... 361/704; 361/719; 257/717; 165/80.2

[58] Field of Search ................ 361/704, 83, 690–697, 361/707, 709–711, 714–715, 717–719, 722; 257/706, 707–717, 721–727; 174/16.3; 165/80.2, 80.3, 133.2–133.4, 185

[56] References Cited

U.S. PATENT DOCUMENTS

| 5,486,981 | 1/1996 | Blomquist | 361/704 |
| 5,648,889 | 7/1997 | Bosli | 361/704 |

*Primary Examiner*—Leo P. Picard
*Assistant Examiner*—Michael Datskovsky
*Attorney, Agent, or Firm*—Bacon & Thomas, PLLC

[57] ABSTRACT

A CPU heat sink clamping device including an elongated clamping plate clamped on a CPU to hold down a heat sink and having an invertedly disposed U-shaped bearing portion in the middle suspended from the heat sink and a screw hole at the center of the bearing portion, and a tightening up screw threaded into the screw hole of the clamping plate and stopped against the heat sink to tighten up the clamping plate.

1 Claim, 4 Drawing Sheets

CPU HEAT SINK CLAMPING DEVICE

BACKGROUND OF THE INVENTION

The present invention relates to a CPU heat sink clamping device which comprises an elongated clamping plate clamped on a CPU to hold down a heat sink, and a tightening up screw threaded into a screw hole in the middle of the clamping plate and stopped at the heat sink to tighten up the clamping plate.

When a heat sink is attached to a CPU for dissipation of heat from it, a clamping plate may be used to secure the heat sink and the CPU together. A clamping plate for this purpose according to the prior art is made from a narrow, resilient metal plate having two sloping portions upwardly outwardly extended from two opposite ends of a flat middle section thereof, two vertical retaining portions respectively extended from the sloping portions, remote from the flat middle section, and two hooked portions respectively extended from the vertical retaining portions at one end remote from the sloping portions. This structure of clamping plate is still not satisfactory in function. When installing the clamping plate, much effort must be applied so that the hooked portions of the clamping plate can be hooked on the bottom side of the CPU. Further, when installed, the clamping plate cannot be conveniently removed from the heat sink and the CPU without the use of a tool.

SUMMARY OF THE INVENTION

The present invention has been accomplished to provide a CPU heat sink clamping device which eliminates the aforesaid drawbacks. It is one object of the present invention to provide a CPU heat sink clamping device which can be conveniently and releasably fastened to a CPU to hold down a heat sink above the CPU, for permitting heat to be quickly dissipated from the CPU through the heat sink. It is another object of the present invention to provide a CPU heat sink clamping device which firmly secures the heat sink and the CPU together when installed. According to the present invention, the CPU heat sink clamping device comprises an elongated clamping plate clamped on a CPU to hold down a heat sink and having an invertedly disposed U-shaped bearing portion in the middle suspended from the heat sink and a screw hole at the center of the bearing portion, and a tightening up screw threaded into the screw hole of the clamping plate and stopped against the heat sink to tighten up the clamping plate.

DETAILED DESCRIPTION OF THE PREFERRED EMBODIMENT

Figure 1:
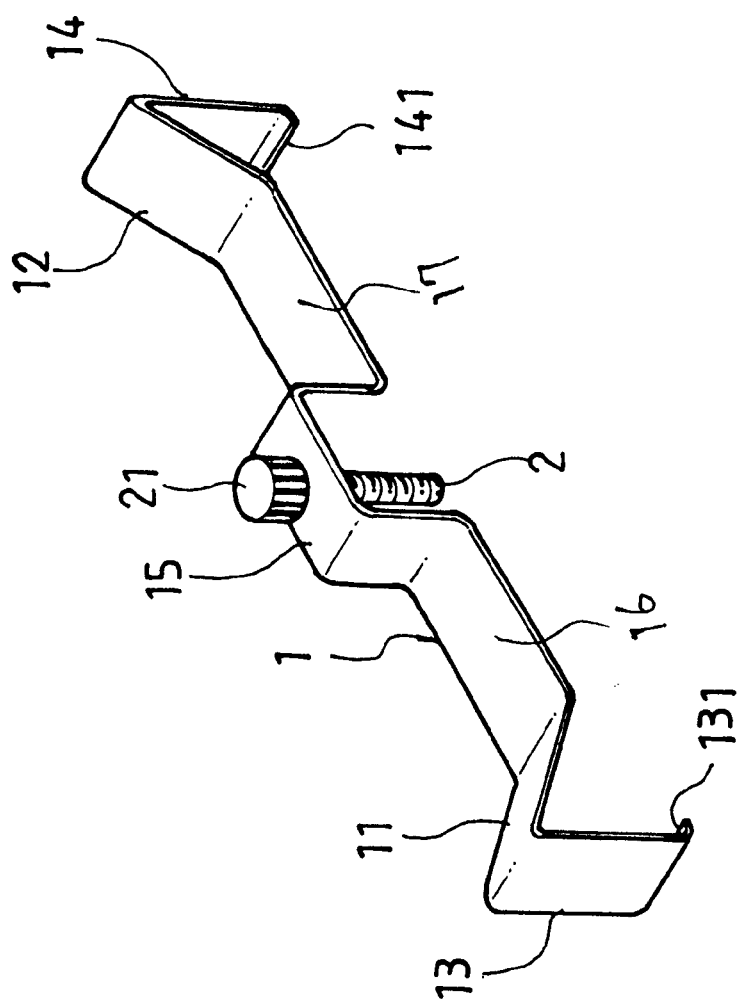
FIG. 1 is a perspective view of a CPU heat sink clamping device according to the present invention.
Figure 2:
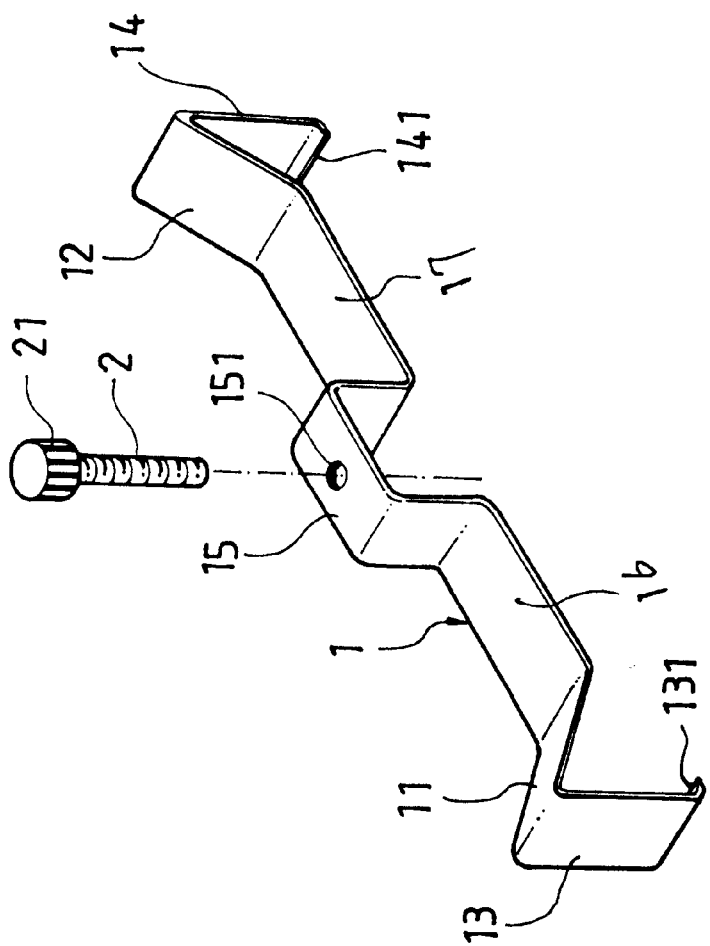
FIG. 2 is an exploded perspective of the CPU heat sink clamping device shown in FIG. 1.

Referring to FIGS. 1 and 2, a CPU heat sink clamping device in accordance with the present invention is generally comprised of a narrow elongate clamping plate 1, and a tightening up screw 2. The clamping plate 1 is made from an elongated resilient material, comprising an invertedly disposed U-shaped bearing portion 15 in the middle, a threaded screw hole 151 at the center of the bearing portion 15, two horizontal shoulders 16;17 respectively extending outwardly from two opposite ends of the bearing portion 15 in reversed directions, two symmetrical sloping portions 11;12, angled upwardly and outwardly shoulders 16;17; from two vertical retaining portions 13;14 respectively connected to the horizontal shoulders 16;17 by the sloping portions 11;12 and disposed at the same elevation, and termination in two inwardly directed hooked portions 131;141 from the vertical retaining portions 13;14 at a bottom side remote from the sloping portions 11;12. The tightening up screw 2 is adapted for threading into the screw hole 151 of the bearing portion 15, having a peripherally longitudinally grooved head 21 convenient for turning with the fingers.

Figure 3:
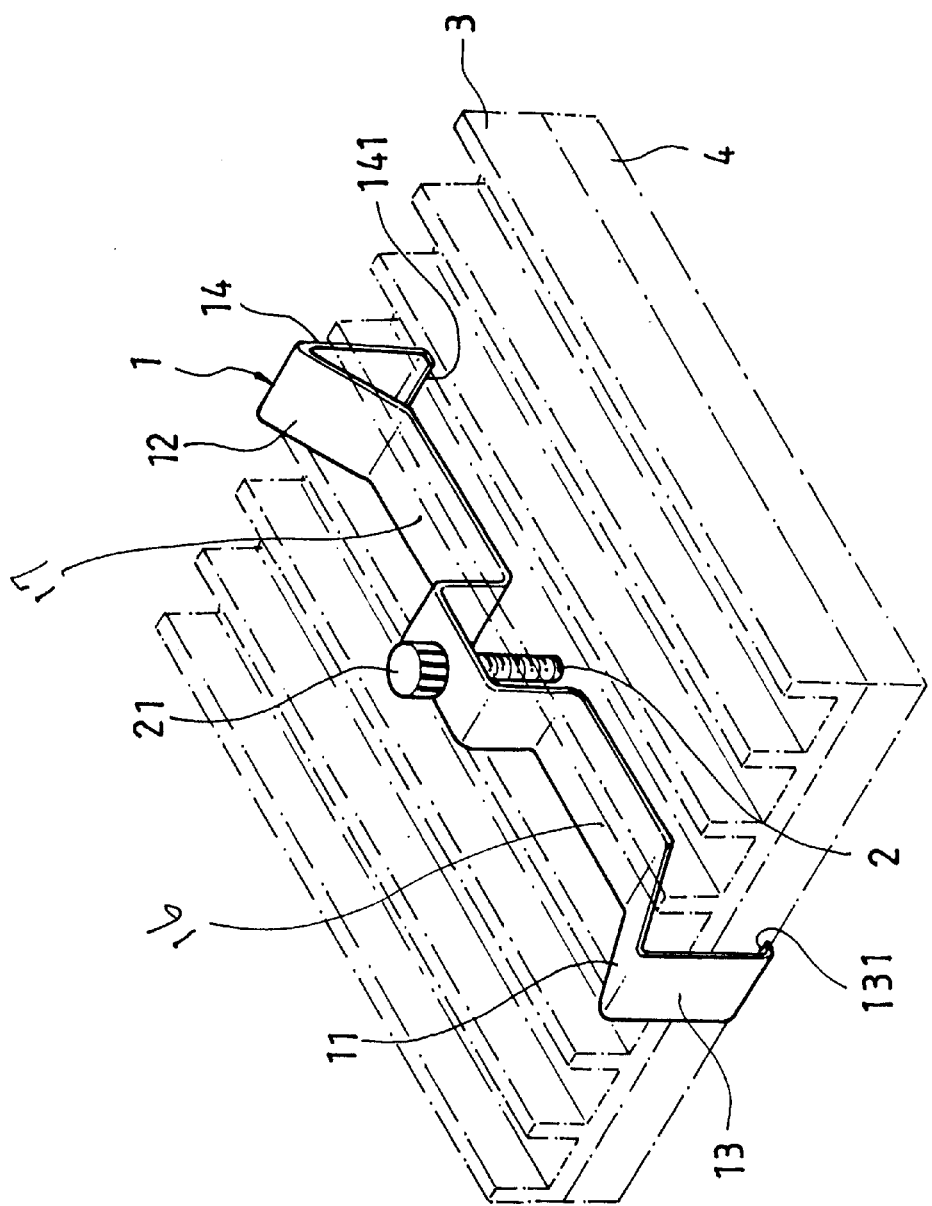
FIG. 3 is a perspective view of the present invention, showing the clamping plate attached to a heat sink and clamped on a CPU.
Figure 4:
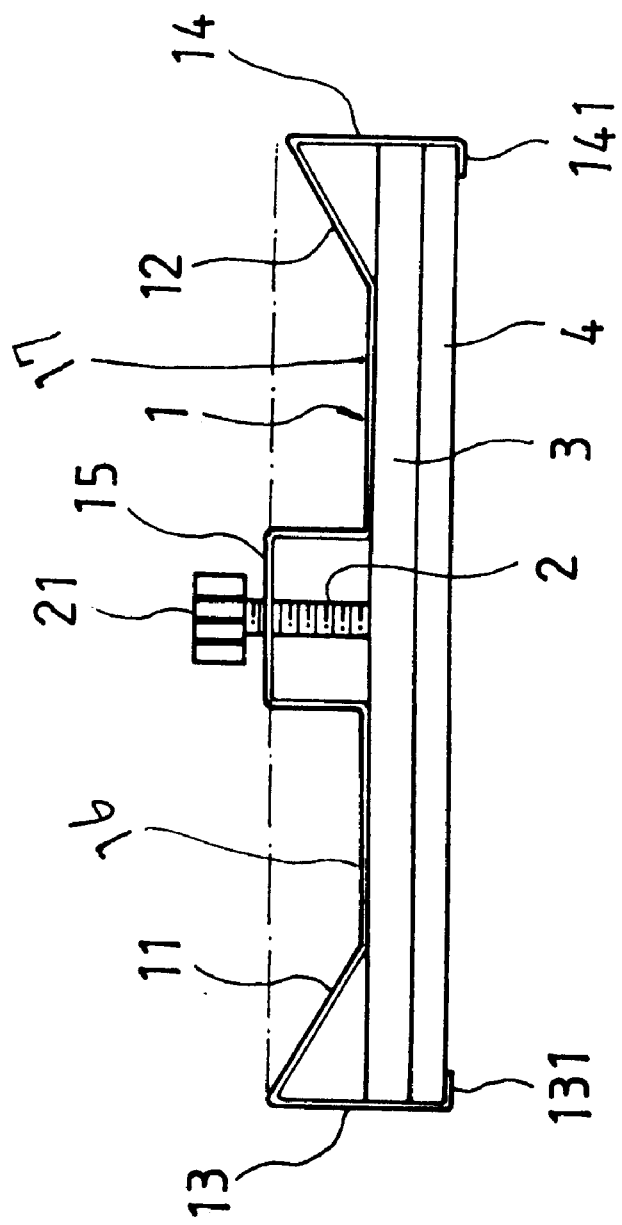
FIG. 4 is a side elevational view showing the tightening up screw fastened tight.

Referring to FIGS. 3 and 4, when the clamping plate 1 is closely attached to one groove between two upright radiating fins of a heat sink 3 above a CPU 4, the vertical retaining portions 13;14 of the clamping plate 1 are respectively attached to the periphery of the heat sink 3 and the CPU 4 at two opposite sides, and the hooked portions 131;141 of the clamping plate 1 are respectively hooked on the bottom side of the CPU 4, and then the tightening up screw 2 is threaded into the screw hole 151 of the clamping plate 15 and stopped at the top side of the heat sink 3 (see FIG. 3). When the tightening up screw 2 is continuously threaded inwards, the bearing portion 15 of the clamping plate 1 is forced to move upwards along the tightening up screw 2, thereby causing the horizontal shoulders 16;17 to pull the sloping portions 11;12 inwards, and therefore the clamping plate 1 is firmly fixed to the heat sink 3 and the CPU 4 to hold down the heat sink 3 on the CPU 4 for quick dissipation of heat from the CPU 4 through the heat sink 3. When the tightening up screw 3 is turned in the reversed direction, the clamping plate 1 is released, and therefore the clamping device can be conveniently removed from the heat sink 3 and the CPU 4.

It is to be understood that the drawings are designed for purposes of illustration only, and are not intended as a definition of the limits and scope of the invention disclosed.

What the invention claimed is:

1. A device for clamping a heat sink to a CPU, the device comprising an elongate clamping plate made of resilient material, the clamping plate being defined by a central bearing portion having an inverted U-shaped configuration, a threaded screw hole formed in the bearing portion, a pair of horizontal shoulders extending outwardly in opposite directions from the bearing portion, each horizontal shoulder terminating in an upwardly and outwardly extending sloping portion, each sloping portion terminating in a retaining portion extending vertically and downwardly therefrom, and each retaining portion terminating in an inwardly directed hook, a screw threadedly engaged through the screw hole and, wherein when the device is disposed on a heat sink and the hook portions are disposed in engagement with opposed portions on the bottom side of a CPU, tightening of the screw downwardly against the heat sink urges the bearing portion away from the heat sink, thereby causing the horizontal shoulders to pull the sloping portions inwardly and tightly secure the heat sink to the CPU.

* * * * *